(12) United States Patent
Baicry et al.

(10) Patent No.: US 9,933,471 B2
(45) Date of Patent: Apr. 3, 2018

(54) CALIBRATION OF A DEVICE FOR MEASURING AN ELECTRIC FIELD IN A CONDUCTING MEDIUM

(71) Applicants: Commissariat à l'Energie Atomique et aux Energies Alternatives, Paris (FR); Institut Polytechnique de Grenoble, Grenoble (FR)

(72) Inventors: Mathieu Baicry, Sassenage (FR); Matthieu Le Prado, Saint-Marcellin (FR); Christine Lefrou, Grenoble (FR); Laure-Line Rouve, Theys (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/033,990

(22) PCT Filed: Nov. 4, 2014

(86) PCT No.: PCT/FR2014/052801
§ 371 (c)(1),
(2) Date: May 3, 2016

(87) PCT Pub. No.: WO2015/067884
PCT Pub. Date: May 14, 2015

(65) Prior Publication Data
US 2016/0274158 A1    Sep. 22, 2016

(30) Foreign Application Priority Data
Nov. 7, 2013 (FR) .................................... 13 60900

(51) Int. Cl.
*G01R 29/12* (2006.01)
*G01R 29/08* (2006.01)
(Continued)

(52) U.S. Cl.
CPC ............... *G01R 29/12* (2013.01); *G01R 5/28* (2013.01); *G01R 29/0814* (2013.01);
(Continued)

(58) Field of Classification Search
CPC .......... G01R 29/12; G01R 5/28; G01R 29/08; G01R 15/14; G01R 15/165;
(Continued)

(56) References Cited

U.S. PATENT DOCUMENTS 4,349,781 A    9/1982    Vozoff
5,440,226 A    8/1995    Blanpain et al.
(Continued)

FOREIGN PATENT DOCUMENTS

CA    2272429 A1    6/1998
FR    2575296 A1    6/1986
WO    20070078804 A2    7/2007

OTHER PUBLICATIONS

Written Opinion of the International Searching Authority for International Application No. PCT/FR2014/052801, 6 pages.
International Search Report filed in PCT/FR2014/052801; dated Feb. 10, 2015; 2 pgs.
(Continued)

*Primary Examiner* — Huy Q Phan
*Assistant Examiner* — Raul Rios Russo
(74) *Attorney, Agent, or Firm* — Moreno IP Law LLC

(57) ABSTRACT

A device for measuring an electric field in a conducting medium comprises: two electrodes separated by a volume of an insulating medium; a device for measuring current coupled to said electrodes; and adjustment elements making it possible to vary a quantity on which the electrical conductivity of the field measuring device depends.

13 Claims, 2 Drawing Sheets

(51) Int. Cl.
*G01R 5/28* (2006.01)
*G01R 35/00* (2006.01)
*G01R 31/26* (2014.01)

(52) U.S. Cl.
CPC ......... *G01R 29/0842* (2013.01); *G01R 35/00* (2013.01); *G01R 35/005* (2013.01); *G01R 31/2642* (2013.01)

(58) Field of Classification Search
CPC .... G01R 19/0023; G01R 29/22; G01R 29/24; G01R 31/12; G01R 5/32; G01R 9/08; G01R 29/0814; G01R 29/0842; G01R 31/2642
USPC .................................. 324/72, 109, 457, 458
See application file for complete search history.

(56) References Cited

U.S. PATENT DOCUMENTS

| | | |
|---|---|---|
| 7,482,813 B2 | 1/2009 | Constable et al. |
| 2008/0184811 A1* | 8/2008 | Stange ...................... G01F 1/58 73/861.08 |
| 2009/0273356 A1* | 11/2009 | Pampin ................ C12Q 1/6816 324/693 |
| 2009/0314066 A1* | 12/2009 | Nieuwenhuis ..... G01N 15/0656 73/61.71 |

OTHER PUBLICATIONS

"Electric Field Measurement at Sea"; J.Y. Bruxelle; IEEE 1997; 4 pgs.

\* cited by examiner

CALIBRATION OF A DEVICE FOR MEASURING AN ELECTRIC FIELD IN A CONDUCTING MEDIUM

The present patent application claims the priority benefit of French patent application 13/60900, which is herein incorporated by reference.

BACKGROUND

The present disclosure relates to a method and a device for measuring an electric field in a conducting medium. It particularly applies to submarine electric field measurements.

DISCUSSION OF THE RELATED ART

An offshore electric field measurement device, or ocean electrometer, comprising two immersed electrodes separated by a distance l, connected to a voltage measurement device, has already been provided. To measure an electric field E in the area located between the two electrodes, voltage U between the electrodes is measured. Field E can be deduced from this measurement by formula E=U/l. Electrometers of this type are called "voltage measurement" electrometers.

A disadvantage of voltage measurement electrometers is that only a very small portion of the current propagating in the conducting medium formed by the sea water is deviated in the voltage measurement device, which raises metrology problems. Further, voltage measurement electrometers are generally bulky. Indeed, to obtain a satisfactory signal-to-noise ratio, distance l separating the two electrodes should be relatively large, typically in the range from a few meters to a plurality of kilometers.

To overcome these disadvantages, another type of device of electric field measurement in a conducting medium, called "current measurement" device, which determines the density of current generated, under the effect of the electric field, in a fixed volume of conducting medium, is provided.

A device of this type is for example described in the doctoral thesis entitled "Appareillage de mesures des très faibles champs électriques en milieu marin: application à la mise en évidence des signaux électromagnétiques induits dans la mer" by Urbain Rakotosoa (Paris 6 University).

Devices of this type, which will be called current measurement electrometers, may be more compact than voltage measurement electrometers, and may further have a better sensitivity.

The present application more specifically relates to current measurement electrometers. It would indeed be desirable to improve certain aspects of existing current measurement electrometers.

SUMMARY

Thus, an embodiment provides a device for measuring an electric field in a conducting medium, comprising: two electrodes separated by a volume of an insulating medium; a current measurement device coupled to the electrodes; and adjustment elements enabling the adjustment of a variable having the electric conductivity of the field measurement device depending thereon, the variable belonging to the group comprising the impedance between the two electrodes of the field measurement device, the distance between the two electrodes, and an active surface area of at least one of the electrodes.

According to an embodiment, the adjustable variable is the impedance between the two electrodes of the field measurement device.

According to an embodiment, the adjustment elements comprise a variable resistor coupled to the electrodes.

According to an embodiment, the adjustable variable is the distance between the two electrodes.

According to an embodiment, the adjustment elements comprise at least one arm of adjustable length coupled with the electrodes.

According to an embodiment, the adjustable variable is an active surface area of at least one of the electrodes.

According to an embodiment, at least one of the electrodes comprises a plurality of conducting panels capable of being interconnected via switches.

According to an embodiment of the present invention, the adjustment elements comprise an insulating element capable of sliding in front of at least one of the electrodes, causing a variation of the electrode surface area in contact with the conducting medium.

According to an embodiment, the device further comprises control and processing elements capable of: a) measuring the current flowing between the two electrodes for at least two different values of the adjustable variable; and b) deducing from the measurements the amplitude of the electric field of the conducting medium, and at least one variable from among the impedance of the electrodes and the conductivity of the conducting medium.

According to an embodiment, the control and processing elements are capable, at step a), of measuring the current flowing between the two electrodes for at least three different values of the adjustment variable and, at step b), of deducing from the measurements the amplitude of the electric field of the conducting medium, the impedance of the electrodes, and the conductivity of the conducting medium.

According to an embodiment, step b) comprises the resolution of a system of equations of the following type:

$$\frac{I}{E} = f\left(\frac{L}{S_A * (Z_{elec} + Z_{int}) * \sigma_e}\right),$$

where I designates the current measured between the electrodes, L designates the distance between electrodes, $S_A$ designates the active surface area of the electrodes, $Z_{elec}$ designate the impedance of the electrodes, $Z_{int}$ designates the impedance between electrodes, $\sigma_e$ designates the conductivity of the conducting medium, and f designates an analytic function representative of the variation of conversion coefficient I/E according to ratio $\sigma_c/\sigma_e$, with $\sigma_c=L/(S_A*(Z_{elec}+Z_{int}))$.

Another embodiment provides a method of calibrating a field measurement device of the above-mentioned type, comprising the steps of: a) measuring the current flowing between the two electrodes for at least two different values of the adjustable variable; and b) deducing from these measurements the amplitude of the electric field of the conducting medium, and at least one variable from among the impedance of the electrodes and the conductivity of the conducting medium.

According to an embodiment, at step a), the current flowing between the two electrodes is measured for at least three different values of said variable and, at step b), the amplitude of the electric field in the conducting medium, the impedance of the electrodes, and the conductivity of the conducting medium are deduced from the measurements.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

Figure 1:
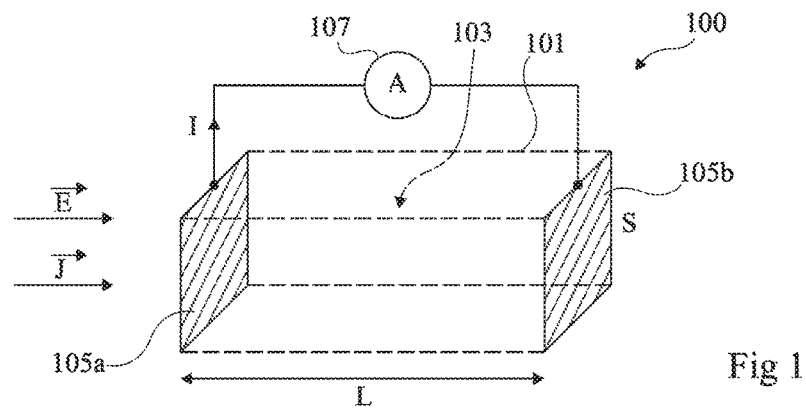
FIG. 1 schematically illustrates an example of a current measurement electrometer.

For clarity, the same elements have been designated with the same reference numerals in the various drawings and, further, the various drawings are not to scale. Further, in the following description, unless otherwise indicated, terms "approximately", "substantially", "about", and "in the order of" mean "to within 10%".

FIG. 1 schematically illustrates an example of a current measurement electrometer 100 intended to be placed in a conducting medium where an electric field is desired to be measured, for example, sea water. Device 100 comprises a tightly closed enclosure 101, shown in dotted lines in the drawing, delimiting a volume 103 of an insulating medium, for example, air or vacuum. Two electrodes 105a and 105b are arranged outside of enclosure 101, so that each electrode has a surface in contact with the conducting medium when the electrometer is immersed. In this example, the two electrodes 105a and 105b are approximately planar and parallel to each other, have substantially the same surface area S, and are separated by a distance L. A current measurement device 107 connects the two electrodes.

In operation, electrometer 100 is immersed in a conducting medium submitted to an electric field E which is desired to be measured. Under the effect of electric field E, a current of density $J=\sigma_e*E$ flows through the conducting medium, $\sigma_e$ designating the electric conductivity of the conducting medium.

Electrodes 105a and 105b enable to channel current density J generated in the conducting medium under the effect of field E. Channeled current I flowing through electrodes 105a and 105b is equal to $I=S*J$. Current I may be measured by current measurement device 107.

Conductivity $\sigma_e$ of the conducting medium where electrometer 100 is used is assumed to be known, and electrometer 100 is such that its impedance is equal to that of the slice of the conducting medium which is replaced with the electrometer. Current I measured by device 107 is then proportional to electric field E, and field E can be deduced from the measurement of current I by formula $E=I/(S*\sigma_e)$. The electrometer may comprise processing means, not shown, capable of determining electric field E from the measurement of current I.

A disadvantage of electrometer 100 is that, in practice, conductivity $\sigma_e$ of the conducting medium may be variable and/or may vary between two measurements, for example, when the salt concentration of the sea water varies when the electrometer is used in a marine environment. Further, over time, electrodes 105a and 105b may alter, which may cause a modification of their impedance, and thus a modification of the impedance of the electrometer. In practice, there may thus be a difference between the impedance of the electrometer and the impedance of the slice of the conducting medium which is replaced by the electrometer. In such conditions, the proportionality coefficient used by the electrometer to determine electric field E from current measurement I is no longer valid, which causes measurement errors.

It would be desirable to have a current measurement electrometer capable of being easily calibrated in its environment of use, to be able to provide accurate electric field measurements, including in the case of a variation of the electric conductivity of the conducting medium being studied, or of the impedance of the electrometer electrodes.

According to an aspect, a current measurement electrometer comprising adjustment means or elements enabling to vary a variable having the electric conductivity of the electrometer depending thereon is here provided.

Electric conductivity of the electrometer here means variable $\sigma_c = L/(S_A*Z_c)$, where $S_A$ designates an active electrode surface area for the channeling of current density J flowing through the conducting medium, and where $Z_c$ designates the impedance of the electrometer $Z_c = Z_{elec} Z_{int}$, $Z_{elec}$ being the impedance of the electrometer electrodes, and $Z_{int}$ being the impedance of the element(s) connected between the electrodes, among which at least current measurement device 107.

The adjustable variable may be impedance $Z_{int}$ of the elements connected between the electrodes, as will be explained in further detail in relation with FIG. 4, distance L between electrodes, as will be explained in further detail in relation with FIG. 5, or active electrode surface area $S_A$ for the channeling of current density J flowing through the conducting medium, as will be explained in further detail in relation with FIG. 6. The adjustment means are provided to enable to set the adjustable variable to a known value.

The studies conducted by the inventors have shown that, for a given current measurement electrometer, in usual conditions of use of the electrometer, current I measured by current measurement device 107 of the electrometer is always proportional to electric field E in the conducting medium, and that proportionality ratio I/E varies according to ratio $\sigma_c/\sigma_e$ between the conductivity of the electrometer and the conductivity of the conducting medium where the electrometer is located, according to a function f such that: $I/E = f(\sigma_c/\sigma_e)$.

For a given electrometer, function f may be determined by calculation (simulation) or experimentally. As an example, to experimentally determine function f, the electrometer may be placed in a controlled environment, for example, in a laboratory test pool, in a conducting medium having a known conductivity $\sigma_e$, and under a known electric field E. A series of successive measurements of current I channeled by the electrometer can then be performed, by modifying, between each measurement, the value of conductivity ratio $\sigma_c/\sigma_e$. To achieve this, the value of the adjustable variable of the electrometer having the electric conductivity of the electrometer depending thereon may for example be modified between each measurement. As a variation, if the experimental equipment enables it, a constant conductivity $\sigma_c$ of the electrometer may be chosen and the value of conductivity $\sigma_e$ of the conducting medium may be varied between each measurement. The value of electric field E being known for a plurality of known values of ratio $\sigma_c/\sigma_e$, the corresponding value $f(\sigma_c/\sigma_e)$ can be deduced. Based on the experimental points of curve $I/E=f(\sigma_c/\sigma_e)$, a mathematical function f' approximating function f and which can be likened to function f can be determined by curve fitting.

Figure 2:
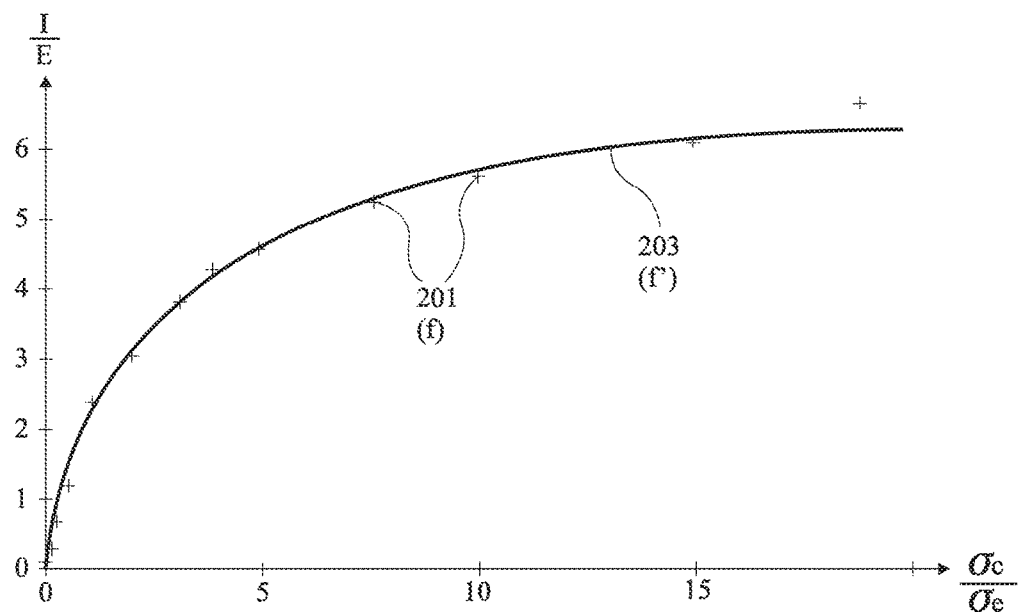
FIG. 2 is a diagram illustrating an aspect of the behavior of a current measurement electrometer.

FIG. 2 is a diagram illustrating the shape of function f for an electrometer comprising an insulating enclosure in the shape of a straight cylinder having a 40-centimeter radius, having its electrodes arranged on the two opposite circular surfaces of the enclosure, and separated by a 1-meter distance L.

In FIG. 2, the axis of abscissas (horizontal in the orientation of FIG. 2) represents ratio $\sigma_c/\sigma_e$, and the axis of ordinates (vertical in the orientation of FIG. 2) represents proportionality ratio I/E, in nA/(nV/m). Crosses 201 of FIG. 2 represent the experimentally-determined points of function f, and full line curve 203 shows function f' approximating function f, determined by a curve adjustment method. In the following, functions f and f' are considered as identical.

Test conducted by the inventors have shown that for any electrometer comprising an insulating enclosure in the shape of a straight cylinder of radius R, having its electrodes arranged on the two opposite circular surfaces of the enclosure, and separated by a distance L, mathematical function f determined by the above-mentioned method can be expressed with the following formula:

$$\frac{I}{E} = f\left(\frac{\sigma_c}{\sigma_e}\right) = S\sigma_e\alpha,$$

where S is the electrode surface area and where $\alpha$ is the following term:

$$\alpha = \frac{\sigma_c}{\sigma_e} + \frac{1 - \frac{\sigma_c}{\sigma_e}}{1 + 1.45\frac{\sigma_c}{\sigma_e}\left(\frac{L}{R}\right)^{0.92}}.$$

More generally, for all usual electrometer forms, a mathematical expression or analytic expression of function f can be determined by the above-mentioned method.

In practice, function f may be determined only once, for example, just after the electrometer manufacturing. The above-mentioned curve adjustment method may be implemented by means of a processing unit which may be internal or external to the electrometer. The electrometer may be equipped with a processing unit capable of calculating values of function f in subsequent in-situ calibration phases, as will be explained in further detail in relation with FIG. 3.

Figure 3:
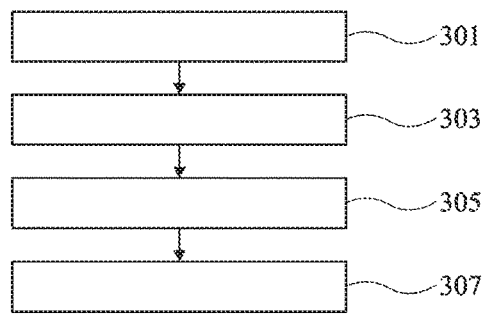
FIG. 3 is a diagram illustrating in the form of blocks an embodiment of a current measurement electrometer calibration method.

FIG. 3 schematically shows in the form of blocks an embodiment of a method of calibrating a current measurement electrometer comprising adjustment means enabling to vary a variable having the electric conductivity of the electrometer depending thereon. In this example, the adjustable variable is impedance $Z_{int}$ of the elements connected between the electrometer electrodes. Transfer function f between conductivity ratio $\sigma_c/\sigma_e$ and proportionality ratio I/E is assumed to be known, and the electrometer comprises a processing unit capable of calculating values of function f.

At a step 301, the impedance of the elements connected between the electrometer electrodes is set to a known value $Z_{int1}$, after which a value I1 of the current channeled by the electrometer is measured.

At a step 303 subsequent to step 301, the impedance of the elements connected between the electrometer electrodes is set to a known value $Z_{int2}$ different from $Z_{int1}$, after which a value I2 of the current channeled by the electrometer is measured.

At a step 305 subsequent to step 303, the impedance of the elements connected between the electrometer electrodes is set to a known value $Z_{int3}$ different from $Z_{int1}$ and from $Z_{int2}$, after which a value I3 of the current channeled by the electrometer is measured.

At the end of these three measurement steps, a system with three equations and three variables is available, and can be expressed as follows:

$$\frac{I1}{E} = f\left(\frac{L}{S_A * (Z_{elec} + Z_{int1}) * \sigma_e}\right)$$

$$\frac{I2}{E} = f\left(\frac{L}{S_A * (Z_{elec} + Z_{int2}) * \sigma_e}\right)$$

$$\frac{I3}{E} = f\left(\frac{L}{S_A * (Z_{elec} + Z_{int3}) * \sigma_e}\right)$$

Values I1, I2, I3, L, $S_A$, $Z_{int1}$, $Z_{int2}$, and $Z_{int3}$ are known values, and values E, $Z_{elec}$, and $\sigma_e$ are the system variables.

At a step 307 subsequent to step 305, the above-mentioned system of equations is solved by any appropriate method of solving a system with three equations and three variables. The value of field E, the value of impedance $Z_{elec}$ of the electrodes, and the value of electric conductivity $\sigma_e$ of the conducting medium being studied are thus determined. The resolution of the equation system may be implemented by a processing unit of the electrometer. Once the values of field E, of impedance $Z_{elec}$, and of conductivity $\sigma_e$ have been determined, impedance $Z_{int}$ of the elements connected between the electrometer electrodes may be set to any known value, and proportionality ratio I/E may be determined by means of function f. As an example, impedance $Z_{int}$ may be set to a value such that $Z_c=Z_{int}+Z_{elec}$ of the electrometer is approximately equal to the impedance of the slice of the conducting medium which is replaced with the electrometer. The described embodiments are however not limited to this specific case.

The calibration of the electrometer is then over, and electric field measurements may be performed based on proportionality coefficient I/E determined at step 307.

The calibration method of FIG. 3 may be repeated as often as necessary to avoid for the possible drift of impedance $Z_{elec}$ and conductivity $\sigma_e$ parameters to cause a significant degradation of the electrometer accuracy.

It will be apparent to the reader that the calibration method of FIG. 3 functions similarly or identically to what has just been described in the case where the adjustable variable of the electrometer is distance L between electrodes, or active electrode surface area $S_A$ for the channeling of current density J. In this case, instead of varying impedance $Z_{int}$ of the elements connected between the electrodes during the different measurement steps 301, 303, and 305 of the calibration method, distance L between electrodes, or active electrode surface area $S_A$ are respectively varied. This then provides, as previously, a system with three equations and three variables which may be solved to determine the values of field E, of impedance $Z_{elec}$, and of conductivity $\sigma_e$ of the conducting medium (step 307).

Figure 4:
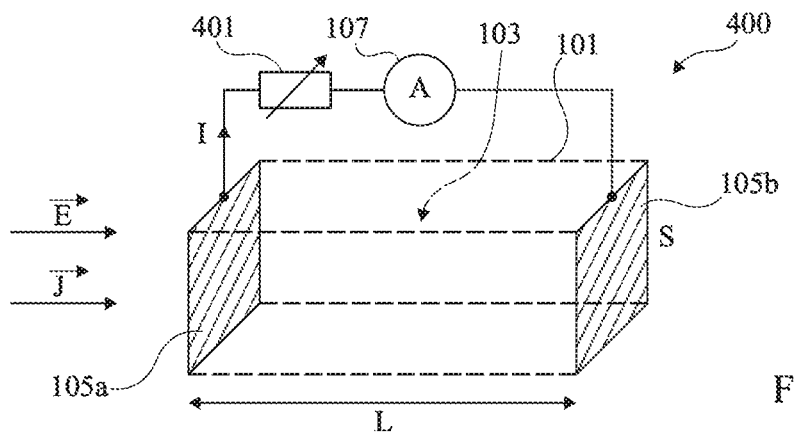
FIG. 4 schematically illustrates an embodiment of a current measurement electrometer.

FIG. 4 schematically illustrates an embodiment of a current measurement electrometer 400 capable of implementing a calibration method of the type described in relation with FIG. 3, where the adjustable variable used for the calibration is impedance $Z_{int}$ of the elements connected between the electrodes.

Like electrometer 100 of FIG. 1, electrometer 400 of FIG. 4 comprises a tightly closed enclosure 101, shown in dotted lines in the drawing, delimiting a volume 103 of an insulating medium, for example, air or vacuum. Electrometer 400 further comprises two electrodes 105a and 105b arranged outside of enclosure 101, so that each electrode has a surface in contact with the conducting medium when the electrometer is immersed. In this example, electrodes 105a and 105b are approximately planar and parallel to each other, and respectively cover two opposite external surfaces of enclosure 101. As a variation, electrodes 105a and 105b may themselves form walls of enclosure 101. In the shown example, enclosure 101 is approximately parallelepipedal and electrodes 105a and 105b cover two rectangular surfaces of same surface area S of enclosure 101. The described embodiments are however not limited to this particular form of electrometer. As a variation, enclosure 101 may have a cylindrical shape or any other appropriate shape, and electrodes 105a and 105b may have a circular shape or any other appropriate shape, planar or non-planar. In this example, electrodes 105a and 105b are separated by a distance L which approximately corresponds to the length of enclosure 101.

As in the example of FIG. 1, electrometer 400 comprises a current measurement device 107 connecting the two electrodes. Device 107 is for example arranged inside of enclosure 101. Device 107 for example is an ammeter. As a variation, device 107 may be a current measurement circuit with a transformer and an amplifier of the type described in the above-mentioned thesis entitled "Appareillage de mesures des trés faibles champs électriques en milieu marin: application à la mise en évidence des signaux électromagnétiques induits dans la mer" by Urbain Rakotosoa (Paris 6 University), particularly in pages 10 to 13 of the thesis, in relation with FIG. I.1 of the thesis. As a variation, device 107 may be a coil system having one or a plurality of magnetometers, of the type described in U.S. Pat. No. 5,440,226, particularly in relation with FIGS. 1 and 2 of this patent.

Electrometer 400 comprises means or elements for adjusting the impedance of the element connected between electrodes 105a and 105b. In the shown example, the adjustment means are formed by a variable resistor 401 coupled between electrodes 105a and 105b, for example, series-connected with device 107 between electrodes 105a and 105b.

Electrometer 400 may further comprise means or control and processing elements, not shown, particularly capable of implementing the above-mentioned calibration method and of performing electric field measurements when the electrometer is calibrated. The control and processing means are particularly capable of controlling variable resistor 401.

Figure 5:
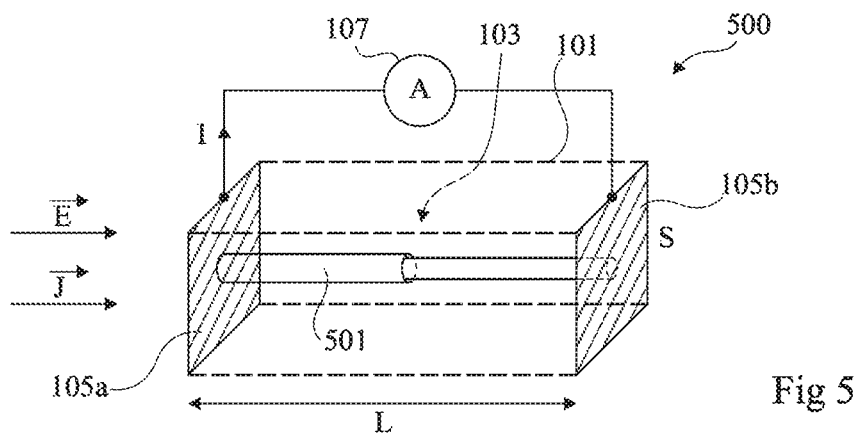
FIG. 5 schematically illustrates an alternative embodiment of a current measurement electrometer.

FIG. 5 schematically illustrates an embodiment of a current measurement electrometer 500 capable of implementing a calibration method of the type described in relation with FIG. 3, where the adjustable variable used during the calibration is distance L between the electrodes. Electrometer 500 of FIG. 5 comprises many elements in common with electrometer 400 of FIG. 4. Only the differences between the two electrometers are discussed hereafter.

Electrometer 500 of FIG. 5 differs from electrometer 400 of FIG. 4 in that, in electrometer 500, distance L between electrodes 105a and 105b is not fixed, but may be set via adjustment means or elements comprising, in this example, at least one arm 501 of adjustable length connecting the two electrodes 105a and 105b. In the shown example, arm 501 is a telescopic arm having a first end attached to electrode 105a substantially at the center thereof and having a second end attached to electrode 105b substantially at the center thereof. The length of arm 501 may be adjusted by means of a motor, not shown. More generally, any other adjustment means enabling to vary distance L separating electrodes 105a and 105b may be provided. The walls of enclosure 101 are for example made of an extensible material, which allows a mobility of electrodes 105a and 105b while preserving the tightness of enclosure 101. As a variation, enclosure 101 may be rigid and at least one of the walls supporting electrodes 105a and 105b may slide in the volume delimited by the other walls of enclosure 101. Tight means may be provided to avoid for sea water to penetrate into enclosure 101 at the interfaces between the mobile wall and the fixed walls of the enclosure.

Electrometer 500 may comprise means or control and processing elements, not shown, particularly capable of implementing the above-mentioned calibration method and of performing electric field measurements when the electrometer is calibrated. The control and processing means are particularly adapted to control the length adjustment of arm 501 in this example.

Electrometer 500 may further optionally comprise a variable resistor (not shown in FIG. 5) coupled between electrodes 105a and 105b, for example, in series with current measurement device 107 as in the example of FIG. 4, enabling to set to a known value impedance $Z_{int}$ of the elements of the electrometer connected between electrodes 105a and 105b. In this case, during step 307 of the calibration method (FIG. 3), once the values of field E, of impedance $Z_{elec}$, and of conductivity $\sigma_e$ have been determined, impedance $Z_{int}$ of the elements connected between the electrometer electrodes may be set to a value such that impedance $Z_c=Z_{int}+Z_{elec}$ of the electrometer is approximately equal to the impedance of the slice of the conducting medium replaced with the electrometer. The described embodiments are however not limited to this specific case.

Figure 6:
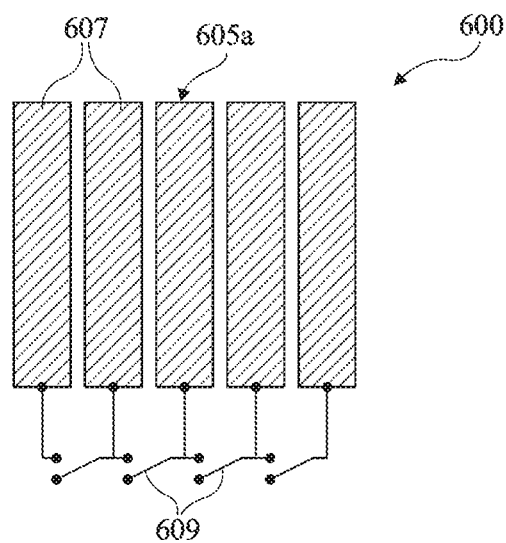
FIG. 6 schematically and partially illustrates another alternative embodiment of a current measurement electrometer.

FIG. 6 schematically and partially illustrates an embodiment of a current measurement electrometer 600 capable of implementing a calibration method of the type described in relation with FIG. 3, where the adjustable variable used during the calibration is active electrode surface area $S_A$ for the channeling of current density J in the conducting medium.

The electrometer of FIG. 6 differs from the electrometer of FIG. 4 mainly by the structure of its electrodes. FIG. 6 shows, in front view, an electrode 605a of the electrometer, arranged on a surface of enclosure 101 (not shown in FIG. 6), replacing electrode 105a of the electrometer of FIG. 4. The electrometer of FIG. 6 may further comprise another electrode (not shown) identical or similar to electrode 605a, arranged on a surface of enclosure 101 opposite to electrode 605a, replacing electrode 105b of the electrometer of FIG. 4.

Electrode 605a comprises, in this example, a plurality of separate metal panels 607. The electrometer of FIG. 6 further comprises adjustment means or elements comprising a plurality of switches 609 enabling to interconnect all or part of conducting panels 607. By selecting, via switches 609, the number of conducting panels 607 which are connected to current measurement device 107 (not shown in FIG. 6) of the electrometer, active electrode surface area $S_A$ may be adjusted for the channeling of current density J in the conducting medium.

The electrometer of FIG. 6 may comprise means or control and processing elements, not shown, particularly capable of implementing the above-mentioned calibration method and of performing electric field measurements when the electrometer is calibrated. The control and processing means are particularly capable of controlling switches 609 in the present example.

The electrometer of FIG. 6 may further optionally comprise a variable resistor (not shown in FIG. 6) coupled between its electrodes, for example, in series with current measurement device 107 as in the example of FIG. 4, enabling to set to a known value impedance $Z_{int}$ of the elements of the electrometer connected between its electrodes. In this case, at step 307 of the calibration method (FIG. 3), once the values of field E, of impedance $Z_{elec}$, and of conductivity $\sigma_e$ have been determined, impedance $Z_{int}$ of the elements connected between the electrometer electrodes may be set to a value such that impedance $Z_c = Z_{int} + Z_{elec}$ of the electrometer is approximately equal to the impedance of the slice of the conducting medium which is replaced with the electrometer. The described embodiments are however not limited to this specific case.

As a variation, to vary active electrode surface area $S_A$ for the channeling of current density J in the conducting medium, it may be provided to mask a portion of the surface of an electrode by means of an insulating element such as an insulating film, an insulating sheet, or an insulating plate, to vary the electrode surface area in contact with the conducting medium. Motor-driven means for driving the insulating element may be provided to cause variations of active surface area $S_A$.

An advantage of the above-described embodiments is that the electrometer may easily be calibrated in situ, which provides accurate electric field measurements, even when impedance values $Z_{elec}$ of the electrodes and conductivity value $\sigma_e$ of the conducting medium where the electrometer is used are likely to drift.

Specific embodiments have been described. Various alterations, modifications, and improvements will readily occur to those skilled in the art.

In particular, a calibration method where three measurements of current I channeled by the electrodes of the electrometer are successively performed, by modifying for each measurement an adjustable variable of the electrometer having the electrometer conductivity depending thereon, has been described hereabove. This enables, by solving a system with three equations and three variables, to determine both field E in the conducting medium, impedance $Z_{elec}$ of the electrometer electrodes, and conductivity $\sigma_e$ of the conducting medium. The case where impedance $Z_{elec}$ of the electrodes is known and stable and where only conductivity $\sigma_e$ of the conducting medium is variable or, conversely, the case where conductivity $\sigma_e$ is known and stable, and where only impedance $Z_{elec}$ of the electrodes is variable, may however be envisaged. In both cases, a calibration method comprising two steps of measuring current I with different values of the adjustable variable of the electrometer, and the resolution of a system with two equations and two variables, may be provided.

Further, it should be noted that the alternative embodiments of FIGS. 4, 5, and 6 may be combined, that is, an electrometer where both impedance $Z_{int}$, active surface area $S_A$, and distance L between electrodes are adjustable, or where any two of these parameters are adjustable, may be provided. During the calibration, it may be provided, between two successive measurements of current I, to vary different adjustable parameters or an appropriate combination of the adjustable parameters, to obtain the desired number of equations.

Further, the described embodiments are not limited to marine environment applications and may be used in other conducting mediums.

The invention claimed is:

1. A device for measuring an electric field in a conducting medium, comprising:
   two electrodes separated by a volume of an insulating medium;
   a current measurement device coupled to said electrodes; and
   adjustment elements enabling the adjustment of a variable having the electric conductivity ($\sigma_c$) of the field measurement device depending thereon, said variable being comprised in the group comprising the impedance ($Z_{int}$) between the two electrodes of the field measurement device, the distance (L) between the two electrodes, and an active surface (SA) of at least one of said electrodes.

2. The device of claim 1, wherein said variable is the impedance between the two electrodes of the field measurement device.

3. The device of claim 2, wherein said adjustment elements comprise a variable resistor coupled to said electrodes.

4. The device of claim 1, wherein said variable is the distance (L) between the two electrodes.

5. The device of claim 4, wherein said adjustment elements comprise at least one arm of adjustable length coupled to said electrodes.

6. The device of claim 1, wherein said variable is an active surface area of at least one of said electrodes.

7. The device of claim 6, wherein at least one of said electrodes comprises a plurality of conductive panels capable of being interconnected via switches.

8. The device of claim 6, wherein said adjustment elements comprise an insulating element capable of sliding in front of at least one of said electrodes, causing a variation of the electrode surface area in contact with the conducting medium.

9. The device of claim 1, further comprising control and processing elements capable of:
   a) measuring the current (I) flowing between the two electrodes for at least two different values of said variable; and
   b) deducing from the measurements the amplitude of the electric field (E) of the conducting medium, and at least one variable from among the impedance of said electrodes and the conductivity of the conducting medium.

10. The device of claim 9, wherein said control and processing elements are capable, at step a), of measuring the current (I) flowing between the two electrodes for at least three different values of said variable and, at step b), deducing from said measurements the amplitude of the electric field (E) of the conducting medium, the impedance of said electrodes, and the conductivity ($\sigma_e$) of the conducting medium.

11. The device of claim 9, wherein step b) comprises solving a system of equations of the following type:

$$\frac{I}{E} = f\left(\frac{L}{S_A * (Z_{elec} + Z_{int}) * \sigma_e}\right),$$

where I designates the current measured between the electrodes, L designates the distance between electrodes, SA designates the active surface area of the electrodes, $Z_{elec}$ designate the impedance of the electrodes, $Z_{int}$ designates the impedance between electrodes, $\sigma_e$ designates the conductivity of the conducting medium, and f designates an analytic function representative of the variation of conversion coefficient I/E according to ratio $\sigma_c/\sigma_e$, with $\sigma_c = L/(S_A*(Z_{elec}+Z_{int}))$.

12. A method of calibrating the field measurement device of claim 1, comprising the steps of:
 a) measuring the current (I) flowing between the two electrodes for at least two different values of said variable; and
 b) deducing from said measurements the amplitude of the electric field (E) of the conducting medium, and at least one variable from among the impedance of said electrodes and the conductivity ($\sigma_e$) of the conducting medium.

13. The method of claim 12, wherein at step a), the current (I) flowing between the two electrodes is measured for at least three different values of said variable and, at step b), the amplitude of the electric field (E) in the conducting medium, the impedance of said electrodes, and the conductivity ($\sigma_e$) of the conducting medium are deduced from said measurements.

\* \* \* \* \*